(12) United States Patent
Adusumilli et al.

(10) Patent No.: US 6,334,198 B1
(45) Date of Patent: *Dec. 25, 2001

(54) METHOD AND ARRANGEMENT FOR CONTROLLING MULTIPLY-ACTIVATED TEST ACCESS PORT CONTROL MODULES

(75) Inventors: Swaroop Adusumilli, Tempe; James Steele, Chandler; David Cassetti, Tempe, all of AZ (US)

(73) Assignee: Koninklijke Philips Electronics N.V. (KPENV), Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/283,171

(22) Filed: Apr. 1, 1999

(51) Int. Cl.[7] .................................................. G01R 31/28
(52) U.S. Cl. .......................... 714/727; 714/30; 714/726
(58) Field of Search ........................... 714/30, 726, 727, 714/729, 724, 720, 733; 341/270; 370/241

(56) References Cited

U.S. PATENT DOCUMENTS

| | | | |
|---|---|---|---|
| 5,627,842 | * | 5/1997 | Brown et al. ......................... 714/727 |
| 5,708,773 | * | 1/1998 | Jeppesen, III et al. ................ 714/30 |
| 6,073,254 | * | 6/2000 | Whetsel .................................. 714/30 |

OTHER PUBLICATIONS

Whetsel, Lee, An IEEE 1149.1 Based Test Access Architecture For ICs With Embedded Cores, Texas Instruments.
IEEE Std 1149.1 (JTAG) Testability Primer, Texas Instruments, 1997 Semiconductor Group.
IEEE Std 1149.1–1990, IEEE Std Test Access Port and Boundary–Scan Architecture, IEEE Computer Society, Oct. 21, 1983.

* cited by examiner

Primary Examiner—Emmanuel L. Moise

(57) ABSTRACT

An arrangement controls an IC designed with multiple "core" circuits, such as multiple CPUs, with each core circuit including its own TAP controller and with multiple TAP controllers enabled at a time. For applications typically requiring that control be transferred between such TAP controllers, one embodiment of the present invention configures a TLM-based design such that multiple TAP controllers can be simultaneously enabled. This alleviates the need to actually transfer the control from one TAP controller to the next. To maintain consistency with the IEEE JTAG recommendation, the TLM-based design is configured such that only one TAP is enabled upon reset. After reset, the TLM controls the multiply-enabled TAP controllers. Another specific example implementation is directed to a circuit control arrangement for such a multi-core IC having each TAP controller generate status and test signals in response to input signals directed to each of the multiple TAP controllers. A TAP link arrangement, including a TAP link module and control signals coupled to each of the multiple TAP controllers, selectively multiplexes the input signals to the multiple TAP controllers and multiplexes the status and test signals provided by the multiple TAP controllers to an output port of the IC.

20 Claims, 1 Drawing Sheet

METHOD AND ARRANGEMENT FOR CONTROLLING MULTIPLY-ACTIVATED TEST ACCESS PORT CONTROL MODULES

RELATED PATENT DOCUMENTS

This application relates to and is filed concurrently with U.S. Pat. applications, Ser. Nos. 09/283,809 entitled "Method And Arrangement For Controlling Multiple Test Access Port Control Modules," and 09/283,648, entitled "Method And Arrangement For Hierarchical Control of Multiple Test Access Port Control Modules." Each of these applications is assigned to the same assignee and incorporated herein in its entirety.

FIELD OF THE INVENTION

The present invention relates generally to testing integrated circuits (ICs) and, more particularly, to IC test methods and arrangements involving multiple test access port controllers, such as used in connection with IEEE JTAG standards.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A wide variety of techniques have been used in IC devices to ensure that, once they are manufactured, they operate fully in compliance with their intended design and implementation specifications. Many of the more complex IC designs include circuits that permit in-circuit testing via the IC access pins. The IEEE 1149.1 JTAG recommendation, for example, provides a test circuit architecture for use inside such ICs. This architecture includes a test access port (TAP) controller coupled to the IC pins for providing access to and for controlling various standard features designed into such ICs. Some of these features are internal scan, boundary scan, built-in test and emulation.

The JTAG recommendation was developed with the understanding that such IC designs would be using only one test access port controller. Sometime after its initial development, however, many IC's are being designed with multiple "core" circuits, such as multiple CPUs, with each core circuit including its own TAP controller. Typically, separate IC pins are used to select one of the TAP controllers for testing and/or debugging the IC. This is problematic, however, in IC applications that require an increasing number of core circuits without increasing the circuit area of the IC and/or the number of IC pins.

One approach that attempts to overcome such difficulty involves use of an internally implemented circuit for selecting which of the TAP controllers is activated during a test/debug mode of operation inside the TAP controller itself. This approach requires a change to the existing structure of the TAP controllers so that special signals can be drawn from and fed to each TAP controller, and requires that each TAP controller have knowledge that it is enabled at a given time. For many applications, however, changing the design of the established TAP controller is expensive. Further, for certain applications, requiring that each TAP controller have knowledge that it is enabled at a given time adversely removes a desired degree of transparency.

For further information concerning with the above issues, reference may be made to an article entitled, "An IEEE 1149.1 Based Test Access Architecture for ICs with Embedded Cores," by Lee Whetsel, and to IEEE Std. 1149.1-1990, and 1149.1-1993, each of which is incorporated herein by reference.

Another IEEE JTAG related problem, also directed to ICs having multiple core circuits, concerns "Scan Chain Control" signaling, which is a JTAG-specified feature. As discussed in connection with the above-referenced applications, Scan Chain Control can be implemented using a Test Link Module (TLM) to pass a test instruction (e.g., TLM Select instruction) to the TAP controller as part of the enablement of a TAP controller. However, certain types of multiple "core" circuits need to maintain the currently-stored instruction for execution rather than the TLM-passed test instruction. In such applications, using Scan Chain Control to transfer control is impractical because passing the test instruction displaces the current instruction and thereby removes the TAP controller's ability to execute the current instruction. This typically results in a failed control transfer. This problem is especially apparent when debugging such multi-core ICs, in that a core in a debug mode is dependent upon the currently-stored instruction and transferring control to another TAP controller requires exiting from the debug mode for the current core.

One approach for addressing the above-characterized Scan Chain Control problem is to duplicate the instructions for each of the TAP controllers. This, however, requires changes to the existing core's instruction register and decoder and, therefore, is not a practical solution for many applications. For further information regarding this type of approach, reference may be made to the above-mentioned article by Lee Whetsel.

For some types of multiple core circuits, the core circuit only has boundary scan chain for the exclusive use of its pins but not for the purpose of selecting the TLM. Because this type of core circuit cannot pass boundary scan chain for the TLM, the TLM control provided via the Scan Chain Support function fails. Similarly, for the core circuit that has no external scan-chain support, there is no way to control transfer back and forth between the core and the TLM.

SUMMARY

According to various aspects of the present invention, embodiments thereof are exemplified in the form of methods and arrangements for controlling an IC designed with multiple "core" circuits, such as multiple CPUs, with each core circuit including its own TAP controller. Such circuits are useful in connection with IC applications that require an increasing number of core circuits without increasing the circuit area of the IC and/or the number of IC pins, and can be implemented to avoid changing existing structures of TAP controllers. For applications typically requiring that control be transferred between such TAP controllers, one embodiment of the present invention configures a TLM-based design such that multiple TAP controllers can be simultaneously enabled. This alleviates the need to actually transfer the control from one TAP controller to the next. To maintain consistency with the IEEE JTAG recommendation, TLM-based design is configured such that only one TAP is enabled upon reset. After reset, the TLM controls the multiply-enabled TAP controllers.

Another specific example implementation is directed to a circuit control arrangement for a multi-core IC having a limited number of access pins for selecting functions internal to the IC. The circuit control arrangement includes multiple test-access port (TAP) controllers, with each TAP controller coupled to a common interface. Further, each TAP controller is enabled while at least one other of the TAP controllers is enabled, and each TAP controller generates status and test signals in response to input signals directed to each of the multiple TAP controllers. A TAP link arrangement, including a TAP link module and control signals coupled to external scan-chain support in at least one of the multiple TAP controllers, selectively multiplexes the input signals to the multiple TAP controllers and multiplexes the status and test signals provided by the multiple TAP controllers to an output port of the IC.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings which.

Figure 1:
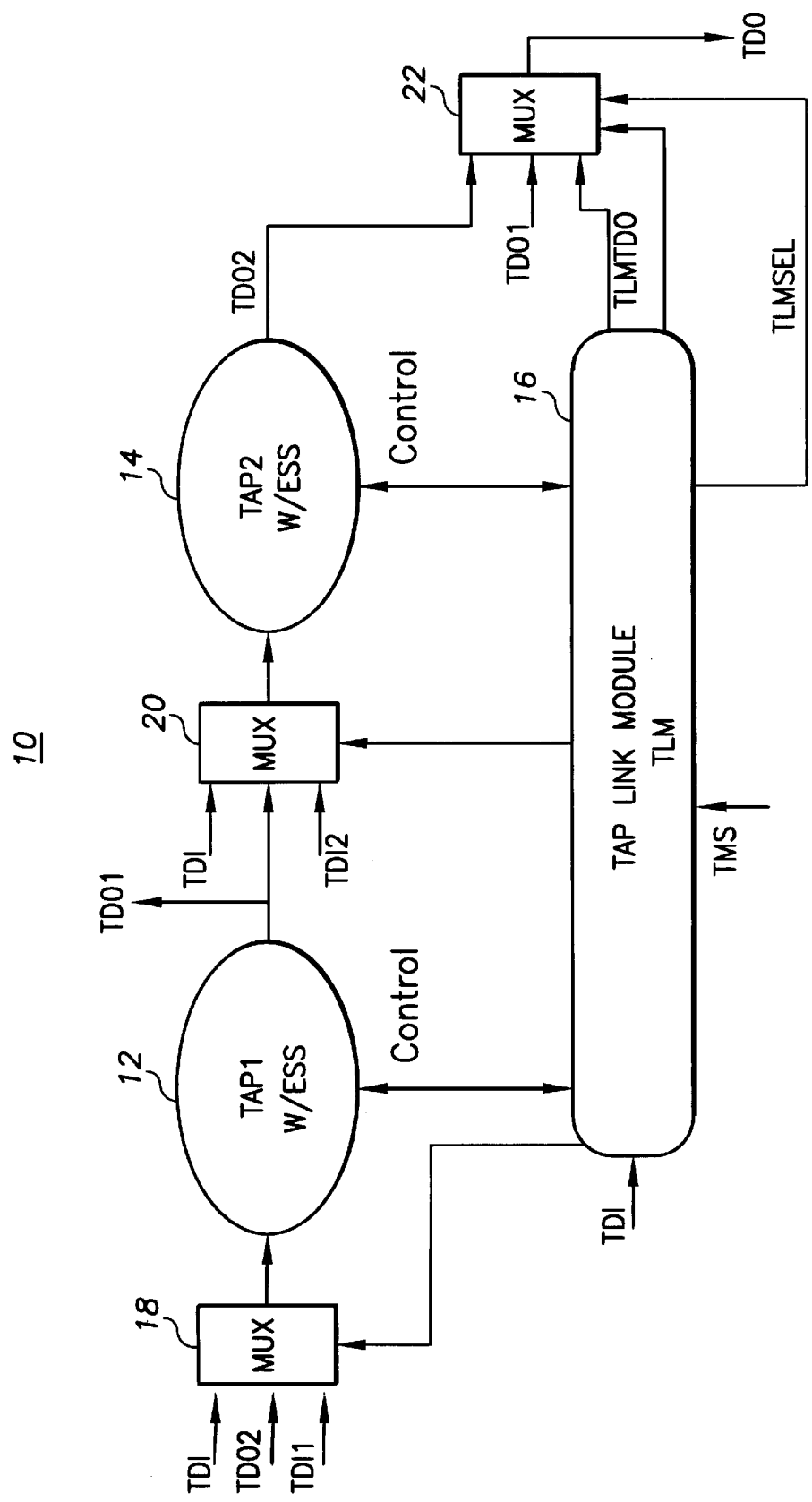
FIG. 1 illustrates a circuit control arrangement for use in a multi-core IC having multiple test-access port (TAP) controllers coordinated using a TAP link controller and having a limited number of access pins for selecting functions internal to the IC, according to an example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of integrated circuit (IC) designs having two or more internal core circuits requiring control and/or coordination during a test/debug stage. The present invention has been found to be particularly advantageous for use in connection with ICs having two or more CPU cores, such the VVS3670 Multi-core Development Chip, which includes the ARM and OAK DSP processors (available from VLSI Technology, Inc. of San Jose, Calif.). While the present invention is not so limited, an appreciation of various aspects of the invention may be obtained through a discussion of various application examples in such environments.

According to an example embodiment, the present invention provides a circuit control arrangement including multiple test-access port (TAP) controllers, an output control circuit and a TAP link module. Each controller has input/output (I/O) signals including input signals coupling to either a JTAG interface or the output of another controller in a cascaded arrangement, and control/status signals communicating with the TAP link module to coordinate enabling and disabling of the multiple TAP controllers via the TMS signal. The output control circuit is adapted to respond to TLMSEL and TAPSEL signals provided by the TAP link module to select an output from the appropriate TAP controller or to select an output from the TAP link module.

In a more specific implementation, the TAP link module (TLM) is a separate functional block implemented with selective output circuitry to control and provide smooth switching between outputs of active TAP controllers in the same IC. At least one of the TAP controllers includes an external scan-chain support that is used to maintain the current instruction for the TAP controller and used by this TAP controller to access a TLM. External scan-chain support is conventional on most re-usable CPU cores, and this aspect functions in at least one TAP controller as is conventional. In response to the TLM switching enablement from one TAP controller to another TAP controller, or in response to more than one TAP controller being enabled at a time, the TLM controls the selective output circuitry to ensure that the data is output from the appropriate block.

Another important aspect of the present invention, consistent with the IEEE 1149.1 recommendation, is that TAP controller arrangement ensures that at least one TAP controller is active at any given time. To maintain consistency with the IEEE JTAG recommendation, the TLM-based design is configured such that only one TAP is enabled upon reset. After reset, the TLM controls the multiply-enabled TAP controllers as described above.

Turning now to the figures, FIG. 1 illustrates another specific example embodiment of the present invention. This embodiment includes a circuit control arrangement 10 used in a multi-core IC having multiple test-access port (TAP) controllers 12 and 14. The TAP controllers 12 and 14 are coordinated using a TAP link module (TLM) 16. Not illustrated is the packaged IC having a limited number of access pins for selecting functions internal to the IC, including those functions associated with the arrangement of FIG. 1. In various embodiments, the TLM 16 and the TAP controllers 12 and 14 are implemented as a shift register, an update register, combinatorial logic, a separate TAP controller, another CPU circuit, and a combination of one or more of the above.

In the example circuit control arrangement 10 of FIG. 1 and according to the present invention, at least each of the illustrated the TAP controllers 12 and 14 includes an external scan-chain support (depicted as "ESS" in FIG. 1) for holding a current instruction. JTAG-recommended interface signals to the IC include TDI (test input) and TCK (test clock). In one more specific example embodiment of the arrangement 10 (consistent with the IEEE JTAG recommendation), at least one of the TAP controllers has external scan-chain support with communication between the TLM 16 and the TAP controller being provided using TMS, CAPTURE, SHIFT and UPDATE signals as characterized and used in the discussion of the IEEE JTAG recommendation; see, for example, Chapters 3–7 therein. For further information concerning the IEEE JTAG recommendation, reference may be made to IEEE Std. 1149.1-1990, and 1149.1-1993, fully incorporated herein by reference.

Such interface signals are fed to and are received by each of the TAP controllers 12 and 14 and to the TLM 16. The TCK signal is used to clock the operations of the TAP controllers 12 and 14 and the TLM 16, as is conventional. In accordance with the illustrated example embodiment of the present invention, the TDI signal is fed directly to the TLM 16 and is fed to each of the TAP controllers 12 and 14 through an associated multiplexer 18 or 20. The multiplexer 18 also receives as inputs a TDI1 signal from an external source, and a TDO2 signal as generated from the TAP controller 14. The multiplexer 20 also receives as inputs TDO1 and TDI2 signals as respectively provided from the TAP controller 12 and from an external source.

The JTAG-recommended interface signal TMS (test mode select) is also fed to and received by the TLM 16, and is used to control corresponding signals internally generated for coordination between the TLM 16 and the TAP controllers 12 and 14. These signals include control and status signals, and select signals for routing data through the multiplexers 18 and 20 and also through output multiplexer 22.

The circuit control arrangement 10 also includes output control circuitry for generating a TDO (test output signal) from the TDO generated by the enabled TAP controller (12 or 14). In the example illustration, the output control circuitry includes the output multiplexer 22. Using the TLM-SEL and TAPSEL signals, the TLM 16 controls the routing of the signals, TLMTDO, TDO1 and TDO2, through the output multiplexer 22 to provide a TDO signal at the output of the IC. This TDO signal, therefore, corresponds to the data output from the TLM 16 or one of the TAP controllers 12 and 14.

The corresponding data output, TDO1 or TDO2, generated by each of the TAP controllers 12 and 14 is passed in the cascaded arrangement of TAP controllers in two ways. First, the corresponding data output is routed directly to the output multiplexer 22 to permit the TLM 16 to select the data output for the TDO signal at the IC level. Second, the corresponding data output is also routed to the next TAP controllers in the cascaded arrangement via one of the multiplexers (e.g., multiplexer 18 or 20) and, for the last of the TAP controllers in the cascaded arrangement, the corresponding data output is also routed to the first TAP controller (TAP controller 12) in the cascaded arrangement via the multiplexer at its input port.

By cascading the TAP controllers 12 ands 14 and their data input and data output signals in this manner, the TLM 16 can readily route data between any two TAP controllers in the cascaded arrangement and have any one or more of the TAP controllers executing instructions concurrently. This is advantageous in that the arrangement permits parallel and selective debugging and testing throughout the IC, and the arrangement reduces the number of test pins necessary for a nominal increase in testing throughput when multiple TAPs are enabled. Further, for the vast majority of currently-built TAP controller configurations, the arrangement permits their various conditions and dependencies to be communicative via the above TLM control scheme.

Also in accordance with the present invention, an alternative embodiment to the arrangement shown in FIG. 1 applies where one of the TAP controllers has external scan-chain support and another TAP controller does not have an available external scan-chain support for accessing the TLM 16. This alternative embodiment can be appreciated by viewing the arrangement of FIG. 1 with the TAP controller 14 not having external scan-chain support, or having external scan-chain support but dedicated exclusively for purposes other than accessing the TLM 16. For such an alternative embodiment, with this control link missing in the TAP controller 14, the TAP controller 14 and the TLM 16 cannot communicate as described above. In accordance with an aspect of the present invention, however, the TAP controller 14 can access the TLM 16 using the TAP controller 12 to pass instructions via TDO2 and the multiplexer 18. Similarly, where the TAP controller 12 does not have an available external scan-chain support for accessing the TLM 16, in accordance with the present invention, the TAP controller 12 can access the TLM 16 using the TAP controller 14 to pass instructions via TDO1 and the multiplexer 20.

In one example embodiment of the present invention, each of the TAP controllers 12 and 14 in FIG. 1 has an available external scan-chain support for accessing the TLM 16. When both TAP controllers are enabled and the instruction register of the TAP controller 14 contains an instruction for execution, the TAP controller 12 can disable the TAP controller 14. This is accomplished via the TLM 16 and the control signals between the TLM 16 and the external scan-chain support associated with the TAP controller 14. Similarly, when both TAP controllers are enabled and the instruction register of the TAP controller 12 contains an instruction for execution, the TAP controller 14 can disable the TAP controller 12 via the TLM 16 and the control signals between the TLM 16 and the external scan-chain support associated with the TAP controller 12.

In yet another embodiment according to the present invention, whether or not one of the TAP controllers 12 and 14 has an available external scan-chain support for accessing the TLM 16, one of the TAP controllers can disable another of the TAP controllers without destroying a current instruction its instruction register. According to the present invention, this is accomplished via the TLM 16 and the control signals (e.g. TMS, CAPTURE, SHIFT and UPDATE) between the TLM 16 and the external scan-chain support associated with the TAP controller to be disabled. In a more specific embodiment of the present invention, the control signals are used in this manner as illustrated and described in connection with concurrently-filed U.S. patent application Ser. No. 09/283,809, entitled "Method And Arrangement For Controlling Multiple Test Access Port Control Modules."

It will be appreciated that illustrating only two cores in the cascaded arrangement is not limiting and that the multiplexers are depicted as functional operators and can be implemented using various structures including those listed above in connection with the discussion of implementations for the TLM 16.

Another important aspect of the present invention concerns compliance with the IEEE JTAG recommendation and the manner in which the TAP controllers respond to a reset signal. The IEEE JTAG recommendation provides for an optional signal referred to as TRST. This signal may be provided from one of the IC pins (or internally generated by a status, such as power-up condition) to functionally reset the TAP controllers 12 and 14 and the TLM 16. If the IC is implemented without a TRST access pin, one specific example approach to resetting the TAP controllers 12 and 14 and the TLM 16 is to implement the circuit control arrangement 10 of FIG. 1 so that one of the TAP controllers 12 and 14 is a unique default TAP controller operative at power-up to reset the other TAP controller(s), using for example the TMS, TCK signals and the TLM 16. Alternatively, without a TRST access pin, another approach to resetting the TAP controllers 12 and 14 and the TLM 16 is to implement the TLM 16 to direct one of the TAP controllers 12 and 14 as the default TAP controller operative at power-up be enabled, with the TLM 16 (or alternatively the default TAP controller) resetting the other TAP controller(s). Yet another alternative is to employ a separate power-up reset circuit similarly causing one of the TAP controllers to act as default-enabled controller, with output control directly and/or indirectly to each of the TAP controllers 12 and 14 and the TLM 16.

In another approach that is inconsistent with IEEE recommendations, only one of the TAP controllers is automatically enabled at power up, for example, the designated default controller. Thereafter, the TLM controls enablement of one or more of the TAP controllers as discussed above.

For a related discussion of such reset approaches, reference may be made to the above-referenced concurrently-filed patent documents.

The various embodiments described above are provided by way of illustration only and are not intended to limit the invention. Those skilled in the art will readily recognize various modifications and changes that may be made to the present invention. For example, it is apparent that the circuitry shown is readily implemented using conventional logic circuits and implementation tools, including but not limited to HDL approaches and programmed microprocessor approaches. Changes such as these that do not strictly follow the example embodiments and applications illustrated and described herein do not depart from the scope of the present invention, which is set forth in the following claims.

What is claimed is:

1. For use in a multi-core IC having a limited number of access pins for selecting functions internal to the IC, a circuit control arrangement, comprising:

multiple test-access port (TAP) controllers, each TAP controller configured and arranged to couple to a common interface, to be enabled while at least one other of the TAP controllers is enabled, and to generate status and test signals in response to input signals directed to each of the multiple TAP controllers; and a TAP link arrangement including a TAP link module and including control signals coupled to each of the multiple TAP controllers, the TAP link arrangement configured and arranged to selectively multiplex the input signals to the multiple TAP controllers and to multiplex the status and test signals provided by the multiple TAP controllers to an output port of the IC.

2. A circuit control arrangement, according to claim 1, wherein the TAP link arrangement is further configured and arranged to selectively multiplex an output signal of at least one of the multiple TAP controllers as an input to another of the multiple TAP controllers.

3. A circuit control arrangement, according to claim 2, wherein at least one of the TAP controllers does not have external scan-chain support adapted for communicating with the TAP link module and is adapted to communicate with the TAP link module via the selective multiplexing of an output signal and said at least one of the TAP controllers having external scan-chain support adapted for communicating with the TAP link module.

4. A circuit control arrangement, according to claim 1, wherein at least one of the TAP controllers has external scan-chain support adapted for communicating with the TAP link module.

5. A circuit control arrangement, according to claim 1, wherein the TAP link arrangement further includes a first multiplexer, responsive to a select signal, for routing an output signal from one of the multiple TAP controllers to the output port of the IC, and a second multiplexer, responsive to a second select signal, for routing one of at least three signals to one of the multiple TAP controllers.

6. A circuit control arrangement, according to claim 5, wherein said at least three signals includes a first test input signal, a second test input signal and an output signal from one of the multiple TAP controllers.

7. A circuit control arrangement, according to claim 1, wherein the TAP link arrangement is responsive to a TMS signal and to a TDI signal.

8. A circuit control arrangement, according to claim 1, wherein one of the multiple TAP controllers includes an instruction register for storing an instruction, and the TAP link arrangement is further configured and arranged to permit said one of the multiple TAP controllers to execute the instruction while scan-chain control maintained by another of the multiple TAP controllers.

9. A circuit control arrangement, according to claim 1, wherein only one of the multiple TAP controllers is enabled upon receipt of a reset signal.

10. A circuit control arrangement, according to claim 1, wherein the TAP link module is adapted to control enablement of the TAP controllers only after said one of the multiple TAP controllers is enabled upon receipt of a reset signal.

11. For use in a multi-core IC having a limited number of access pins for selecting functions internal to the IC, a circuit control arrangement, comprising:

multiple test-access port (TAP) controllers, each TAP controller configured and arranged to couple to an interface means for interfacing to the IC, to be enabled while at least one other of the TAP controllers is enabled, and to generate status and test signals in response to input signals directed to each of the multiple TAP controllers; and a TAP link arrangement including a TAP link means for communicatively coupling to the TAP controllers and including control signals coupled to each of the TAP controllers, the TAP link arrangement configured and arranged to selectively multiplex the input signals to the multiple TAP controllers and to multiplex the status and test signals provided by the multiple TAP controllers to an output port of the IC.

12. For use in a multi-core IC having a limited number of access pins for selecting functions internal to the IC and having multiple test-access port (TAP) controllers, a method for controlling the operation of the IC, comprising:

enabling at least one of the TAP controllers while at least one other of the TAP controllers is enabled;

using at least one of the TAP controllers to generate status and test signals in response to input signals directed to each of the multiple TAP controllers; and at a central location, controlling enablement of the TAP controllers and routing control and input/output signals to and from each of the TAP controllers, including selectively multiplexing the input signals to the multiple TAP controllers and selectively multiplexing status and test signals provided by the multiple TAP controllers to an output port of the IC.

13. A method, according to claim 12, further including selectively multiplexing an output signal of at least one of the multiple TAP controllers as an input to another of the multiple TAP controllers.

14. A method, according to claim 12, further including using one of the TAP controllers to disable another one of the TAP link controllers via communication using the TAP link module.

15. A method, according to claim 12, further including routing one of at least three signals to one of the multiple TAP controllers.

16. A method, according to claim 15, wherein said at least three signals includes a first test input signal, a second test input signal and an output signal from one of the multiple TAP controllers.

17. A method, according to claim 12, wherein controlling enablement of the TAP controllers is responsive to a TMS signal and to a TDI signal, and further including communicating between at least a selected one of the TAP controllers and the TAP link module using external scan-chain support adapted for at least one of the TAP controllers.

18. A method, according to claim 12, further including storing an instruction in one of the multiple TAP controllers.

19. A method, according to claim 18, wherein controlling enablement includes permitting said one of the multiple TAP controllers to execute the instruction while scan-chain control is maintained by another of the multiple TAP controllers.

20. A method, according to claim 12, wherein controlling enablement includes permitting only one of the multiple TAP controllers to be enabled upon receipt of a reset signal.

* * * * *